United States Patent [19]

Liou

[11] Patent Number: 5,581,119
[45] Date of Patent: Dec. 3, 1996

[54] IC HAVING HEAT SPREADER ATTACHED BY GLOB-TOPPING

[75] Inventor: Shiann-Ming Liou, Campbell, Calif.

[73] Assignee: National Semiconductor Corporation, Santa Clara, Calif.

[21] Appl. No.: 437,838

[22] Filed: May 9, 1995

Related U.S. Application Data

[62] Division of Ser. No. 206,011, Mar. 4, 1994, Pat. No. 5,434,105.

[51] Int. Cl.⁶ .................................................. H01L 23/495
[52] U.S. Cl. ........................ 257/676; 257/790; 257/796
[58] Field of Search ................................. 257/790, 676, 257/796, 666, 660

[56] References Cited

U.S. PATENT DOCUMENTS

| | | | |
|---|---|---|---|
| 4,189,083 | 2/1980 | Johnson et al. | 437/211 |
| 4,214,364 | 7/1980 | St. Louis et al. | 29/827 |
| 4,835,120 | 5/1989 | Mallik et al. | 437/209 |
| 4,849,856 | 7/1989 | Funari et al. | 361/386 |
| 4,891,687 | 1/1990 | Mallik et al. | 357/70 |
| 4,942,140 | 7/1990 | Ootsuki et al. | 437/211 |
| 5,091,341 | 2/1992 | Asada et al. | 437/212 |
| 5,225,710 | 7/1993 | Westerkamp | 257/796 |
| 5,309,322 | 5/1994 | Wagner et al. | 361/723 |
| 5,362,680 | 11/1994 | Heinen et al. | 437/209 |
| 5,406,124 | 4/1995 | Morita et al. | 257/676 |

FOREIGN PATENT DOCUMENTS

| | | | |
|---|---|---|---|
| 45-21535 | 7/1970 | Japan | 437/209 |
| 54-46472 | 4/1979 | Japan | 437/209 X |
| 55-134951 | 10/1980 | Japan | 257/717 |
| 57-76868 | 5/1982 | Japan | 437/211 |
| 60-160627 | 8/1985 | Japan | 437/211 |
| 62-73636 | 4/1987 | Japan | 437/211 |
| 169746 | 7/1988 | Japan | 257/790 |

OTHER PUBLICATIONS

R. W. Nuter "High Density Interconnectable Package" IBM Technical Disclosure Bulletin vol. 16, No. 9 Feb. 1974 p. 2893.

*Primary Examiner*—Sara W. Crane
*Assistant Examiner*—Roy Potter
*Attorney, Agent, or Firm*—Hickman Beyer & Weaver

[57] ABSTRACT

A method is disclosed for packaging an integrated circuit having a heat spreader for cooling an integrated circuit die and glob-topping to both protect bonding wires and attach the heat spreader to a lead frame. The adhesion from glob-topping replaces that of double-sided tape in the prior art. The heat spreader includes an electrically insulating layer to replace the electrical insulation provided by double-sided tape in the prior art.

11 Claims, 3 Drawing Sheets

IC HAVING HEAT SPREADER ATTACHED BY GLOB-TOPPING

The present application is a Divisional of application Ser. No. 08/206,011, filed Mar. 4, 1994, now U.S. Pat. No. 5,434,105.

BACKGROUND OF THE INVENTION

The present invention relates generally to the packaging of integrated circuits utilizing a heat spreader to cool an integrated circuit die. More particularly it relates to an arrangement utilizing glob-topping material to protect bonding wires and to secure the heat spreader to a lead frame.

Semiconductor integrated circuits are currently mass produced for a broad range of purposes. Therefore, continual cost and quality improvements in their manufacture are valuable. Significant savings in the packaging of one integrated circuit can generate large overall cost savings when mass produced.

In high performance integrated circuits, heat dissipation can be a serious problem. To combat it, some manufacturers have introduced heat spreaders to strengthen the heat coupling from an integrated circuit die to the lead frame where heat can then pass through the leads of the lead frame to the circuit board. These heat spreaders are attached to lead frames by double-sided tape. By way of example, polyimide tape is commonly used. When the heat spreader is formed front an electrically conductive material, the tape acts as an electrical insulator to prevent the shorting of the leads of the lead frame.

A conventional process for packaging an integrated circuit using a heat spreader without a die attach pad is illustrated diagrammatically in FIGS. 1a–c. FIG. 1a shows a heat spreader 20 affixed via double-sided tape 15 to a lead frame 10. The tape 15 prevents the heat spreader 20 from shorting the leads of the lead frame 10. An integrated circuit die 25 is then attached to the heat spreader as seen in FIG. 1b. This is typically accomplished in a die bonding machine. This assembly then goes to a wire bonder where the wires 30 of FIG. 1c are electrically connected to the integrated circuit die and the lead frame.

While improving heat dissipation, the heat spreader has a serious cost drawback. The use of a tape adhesive to bond it to the lead frame is relative expensive. If it could be eliminated, a major cost savings would be achieved.

Glob-topping is a conventional technique for protecting bonding wires which connect a die to a lead frame during manufacture. The final step in packaging an integrated circuit is to encase it in a plastic molding. Typically, molten plastic is transferred into a mold surrounding the wires, the die, the heat spreader, and a portion of the lead frame. The plastic used during the transfer mold process is relatively viscous. Therefore, the flow of plastic into the mold has been known to damage the bonding wires. This is called the wire wash problem. Some manufacturing processes apply a protective low-viscosity glue over the wires before injecting the plastic to prevent wire wash damage. This glue and the process of applying it are both called glob-topping.

FIGS. 2a–c provide a diagrammatic illustration of a packaging process using glob-topping. FIG. 2a shows a lead frame 10 electrically connected to an integrated circuit die 25 by bonding wires 30. The integrated circuit die 25 is attached to a die attach pad 27. Before encasing the integrated circuit in plastic, one applies a glob-topping material 40 as in FIG. 2b. This glob-topping freezes the wires in position. After curing of the glob-topping, the assembly is put into a mold where molten material is transferred. The glob-topping effectively protects the bonding wires during the transfer molding. FIG. 2c shows a final form of the packaged integrated circuit after encasement in the packaging material 45. In the final form only the leads of the lead frame are exposed.

SUMMARY OF THE INVENTION

To achieve the foregoing and other objects and in accordance with the purpose of the present invention, a method is disclosed for packaging an integrated circuit having a die, a heat spreader for cooling the die, and a lead frame for electrically coupling the die to external circuitry. An integrated circuit die is attached to a first surface of a heat spreader. The heat spreader with the die attached is aligned with a lead frame, and the die is wire bonded to the lead frame using bonding wires. The wire bonding is glob-topped to both protect the bonding wires and to attach the heat spreader to the lead frame. The heat spreader, the die, the glob-topping, the bonding wires and a portion of the lead frame are then encapsulated in a packaging material.

In a preferred embodiment, the die attaching step is accomplished by a die bonding machine. In another preferred embodiment, the wire bonding step is performed by a wire bonding machine. The aligning step may be performed at the wire bonding machine or on a carrier. The glob-topping step may be performed while the die and heat spreader are supported by the wire bonding machine.

In an apparatus aspect of the invention, a packaged integrated circuit is disclosed including a heat spreader having an electrically insulating layer, an integrated circuit die, a lead frame, bonding wires, glob-topping, and packaging material. An integrated circuit die is attached to a first surface of the heat spreader. A lead frame is aligned adjacent to the heat spreader such that the electrically insulating layer of the heat spreader contacts the lead frame. Bonding wires connect the die to the lead frame. A glob-topping covers the bonding wires and attaches the heat spreader to the lead frame. A packaging material encapsulates the die, the heat spreader, the glob topping and at least a portion of the lead frame.

In preferred embodiments, the insulating layer is not tape. The insulating layer of the heat spreader may take the form of an anodized layer of an aluminum heat spreader, polyimide paste, epoxy, or other suitable materials. Elimination of the tape provides a major cost savings. It is several times more expensive to use tape instead of an anodized layer, epoxy, polyimide paste.

In another preferred embodiment, the glob-topping is either epoxy or polyimide. The adhesive properties of these glob-toppings are comparable to those of the glues on the tape. Consequently, the bonding of the heat spreader to the lead frame is much stronger than the prior an because it utilizes a much larger surface area. Of course, the prior an advantages of the attachment of the heat spreader directly to the integrated circuit die and of the glob-topping of the wires are maintained in the present invention.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF ILLUSTRATIVE EMBODIMENTS

Referring next to FIGS. 3a–e, a presently preferred embodiment of the invention will be described in detail. Initially, an integrated circuit die 125 is attached to a heat spreader 120 as in FIG. 3a. This attachment can occur in a conventional die bonding machine. The heat spreader has an electrically insulating layer on the surface facing the die.

The only material requirement for the heat spreader is that it be thermally conductive. Sample heat spreader materials include aluminum and copper. If the heat spreader material is also electrically conductive, the heat spreader will need an electrically insulating layer to prevent shorting of the leads of the lead frame. In the prior art, this insulation was provided by double-side tape. Sample insulators in the present invention include polyimide paste, epoxy, and anodized aluminum layers. These materials need only be about 1 mil thick to provide the required electrical insulation. The double-sided tape was typically 3.6 mils thick. Since the thermal conductivities of the sample layers are comparable to those of the tape, the heat transfer in the present invention from the heat spreader to the lead frame will be comparable to, or better than, the prior art.

Figure 1A:
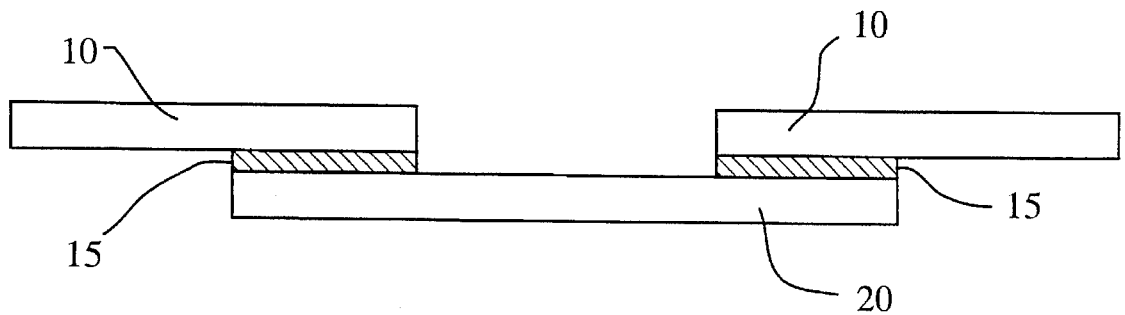
FIGS. 1a–c illustrates a conventional method of packaging an integrated circuit incorporating a heat spreader where the heat spreader is taped to a lead frame.
Figure 1B:
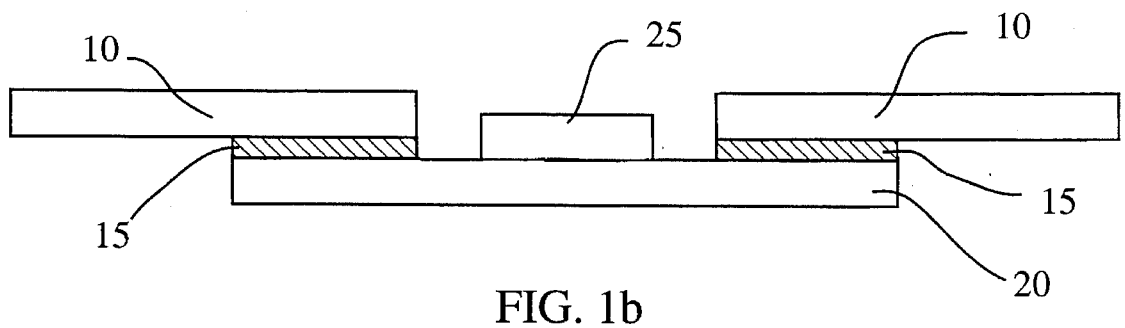
Figure 1C:
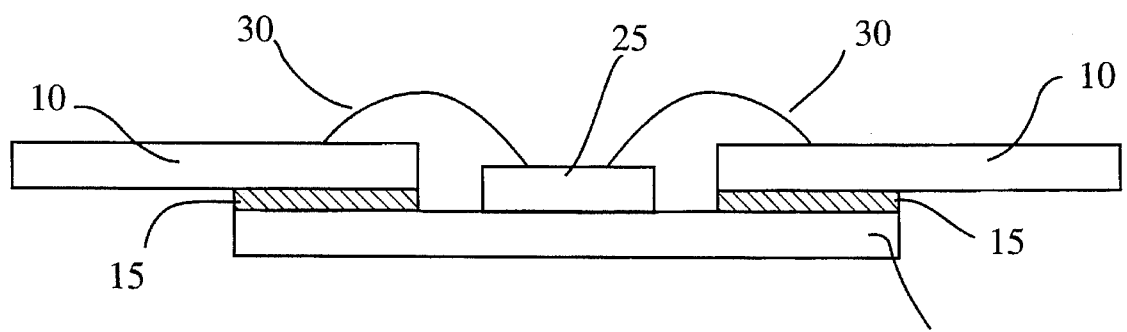
Figure 2A:
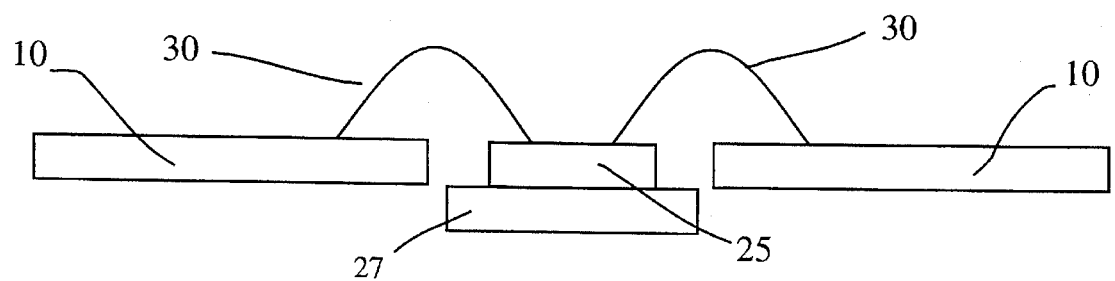
FIGS. 2a–c illustrates a conventional method of packaging an integrated circuit using glob-topping to protect bonding wires.
Figure 2B:
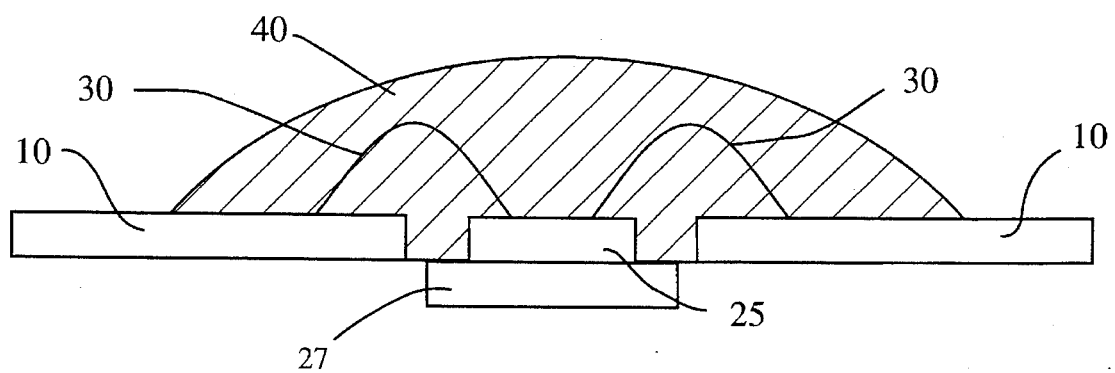
Figure 2C:
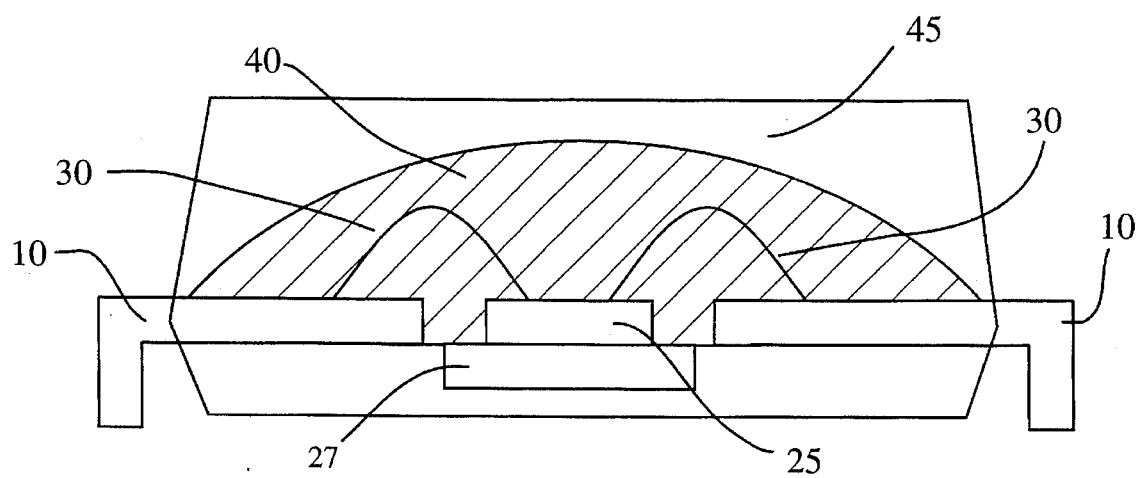
Figure 3A:
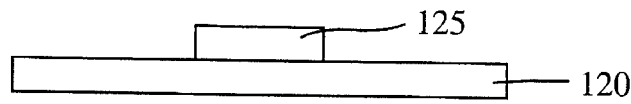
FIGS. 3a–e illustrates a method of packaging an integrated circuit incorporating a heat spreader and glob-topping in accordance with the present invention.
Figure 3B:
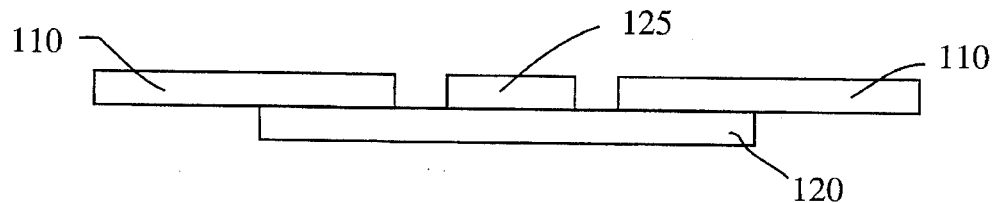

After the die has been attached to the heat spreader, the die/heat spreader assembly is aligned with a lead frame 110. The resulting arrangement is shown in FIG. 3b. The alignment step can easily occur in the wire bonding machine. However, the alignment is in no way restricted to be done in this machine. Indeed, the alignment can be done while the lead frame is on carrier in any suitable location.

Figure 3C:
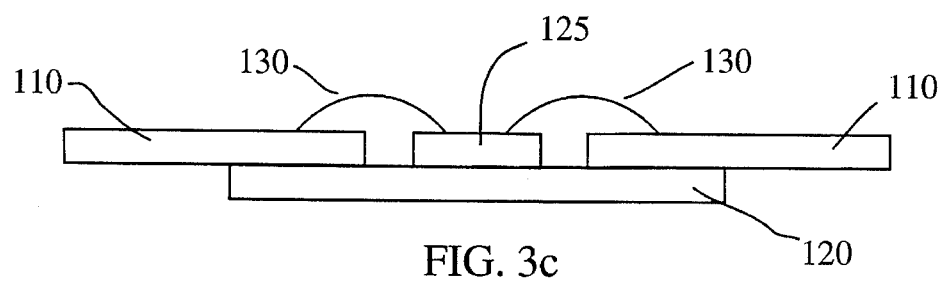

Bonding wires 130 are ultrasonically welded to the die 125 and to the lead frame 110 to electrically couple the die to the lead frame as is best seen in FIG. 3c. Standard wire bonding techniques can be used. The bonding wires are typically formed from gold, aluminum, or copper, although other suitable materials may be used.

Figure 3D:
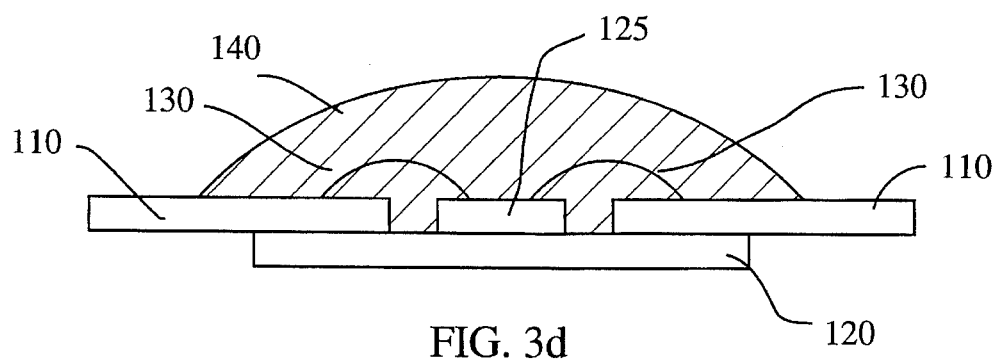

After the wire bonding has been completed, glob-topping 140 is applied as illustrated in FIG. 3d. The glob-topping in FIG. 3d is then cured. As in the prior art, a major advantage of the glob-topping is to protect the bonding wires. Therefore, although it can be performed in the wire bonder or other machines, the glob-topping must occur after the wires are bonded.

Glob-topping materials need to be adhesive to freeze the bonding wires in place, electrically non-conductive to prevent shorting of the wires, and have relatively low viscosity to prevent damaging the bonding wires. Sample glob-topping materials include polyimide and epoxy. Although these same materials were mentioned above as sample insulating layers, the glob-topping material need not be the same as the material used for the insulating layer on the heat spreader. For example, one could use an aluminum heat spreader with an insulating layer of anodized aluminum and glob-top with epoxy.

The adhesive properties of epoxy and polyimide are comparable to those of the glues on the double-sided tape used in prior art methods of attaching the heat spreader to the lead frame. Consequently, the bonding of the heat spreader to the lead frame is much stronger than the prior art because it utilizes a much larger surface area.

Figure 3E:
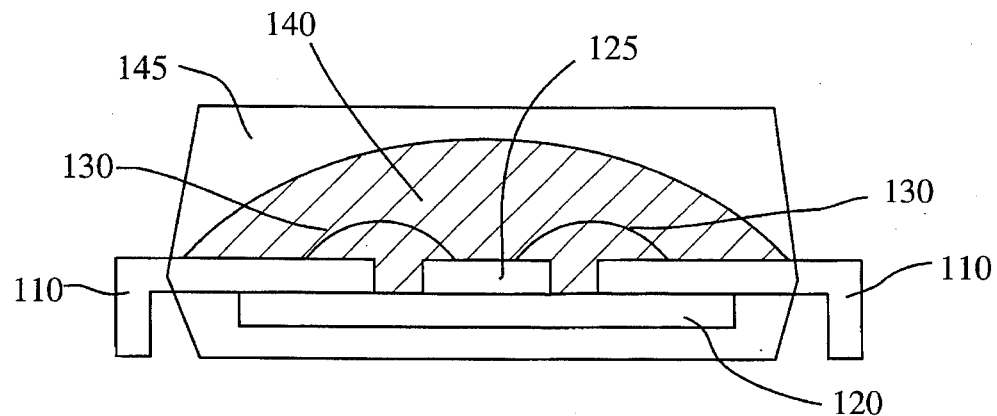

The final packaging step is to encase the assembly of FIG. 3d in a molding 145 as shown in FIG. 3e. This can be done in the standard way by putting the assembly in a transfer mold and injecting the mold with a molten material.

A typical molding is plastic, although other suitable packaging materials may be used. As in conventional processes, the glob-topping of the present invention prevents wire wash damage caused by the flow of molten plastic during this manufacturing stage. The glob-topping also prevents cracks at the corners of large dies after molding by buffering the die against stresses transferred to it by the encasement molding.

The present invention offers the advantages of the heat spreader without the need for double-sided tape. Elimination of the tape provides a major cost savings per package which is magnified by the number of units made under mass production. The strength of the attachment of the heat spreader to the lead frame is also stronger. Of course, the wire protective properties of glob-topping are retained.

Although only one embodiment of the present invention has been described in detail, it should be understood that the present invention may be embodied in many other specific forms without departing from the spirit or scope of the invention. Particularly, the processes can be performed in a panoply of machines and the specific materials need not be those disclosed. For example, the glob-topping adhesive need not be the same material as the electrically insulating layer on the heat spreader. The glob-topping is not restricted to be epoxy or polyimide, but it must be adhesive, electrically non-conductive, and have relatively low viscosity. Also, the electrically insulating layer need only be reasonably thermally conductive and need not be anodized aluminum, epoxy, or polyimide. Therefore, the present examples are to be considered as illustrative and not restrictive, and the invention is not to be limited to the details given herein, but may be modified within the scope of the appended claims.

I claim:

1. A packaged integrated circuit comprising:
   (a) a heat spreader, the heat spreader including an electrically insulating layer;
   (b) an integrated circuit die attached to a first surface of the heat spreader;
   (c) a lead frame aligned adjacent to the heat spreader such that the electrically insulating layer of the heat spreader contacts the lead frame but does not substantially adhere the heat spreader to the lead frame;
   (d) a plurality of bonding wires electrically coupling the die to the lead frame;
   (e) a glob-topping which covers the bonding wires and attaches the heat spreader and the lead frame, the glob-topping being the means for securing the heat spreader to the lead frame wherein no tape or additional adhesive is used to secure the heat spreader to the lead frame; and
   (f) a packaging material for encapsulating the die, the heat spreader, the glob topping and at least a portion of the lead frame.

2. A packaged integrated circuit as recited in claim 1 wherein the insulating layer is not tape.

3. A packaged integrated circuit as recited in claim 1 wherein the heat spreader is formed from aluminum and the insulating layer is an anodized aluminum surface layer.

4. A packaged integrated circuit as recited in claim 1 wherein the insulating layer is epoxy.

5. A packaged integrated circuit as recited in claim 1 wherein the insulating layer is polyimide paste.

6. A packaged integrated circuit as recited in claim 1 wherein the glob-topping is epoxy.

7. A packaged integrated circuit as recited in claim 1 wherein the glob-topping is polyimide.

8. A packaged integrated circuit as recited in claim 1 wherein the heat spreader is copper.

9. A packaged integrated circuit as recited in claim 1 wherein the packaging material is plastic.

10. A packaged integrated circuit as recited in claim 1 wherein the first surface is a second surface of the electrically insulating layer of the heat spreader.

11. A packaged integrated circuit as recited in claim 1 wherein the electrically insulating layer is non-adhesive.

* * * * *

UNITED STATES PATENT AND TRADEMARK OFFICE
CERTIFICATE OF CORRECTION

PATENT NO.   : 5,581,119
DATED        : December 3, 1996
INVENTOR(S)  : Shiann-Ming Liou It is certified that error appears in the above-indentified patent and that said Letters Patent is hereby corrected as shown below:

Column 1, line 29, please change "front" to --from--.

Column 2, line 56, please change "an" to --art--.

Column 2, line 57, please change "an" to --art--.

Column 4, line 48, please change "dic" to --die--.

Signed and Sealed this

Fifteenth Day of July, 1997

Attest:

BRUCE LEHMAN

Attesting Officer

Commissioner of Patents and Trademarks